United States Patent
Pavan et al.

(10) Patent No.: US 7,326,615 B2
(45) Date of Patent: Feb. 5, 2008

(54) METHOD FOR MANUFACTURING ELECTRONIC NON-VOLATILE MEMORY DEVICES INTEGRATED IN A SEMICONDUCTOR SUBSTRATE

(75) Inventors: Alessia Pavan, Merate (IT); Giorgio Servalli, Ciserano (IT); Cesare Clementi, Busto Arsizio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 211 days.

(21) Appl. No.: 11/319,750

(22) Filed: Dec. 27, 2005

(65) Prior Publication Data

US 2006/0166439 A1   Jul. 27, 2006

(30) Foreign Application Priority Data

Dec. 28, 2004   (IT) .......................... MI2004A2532

(51) Int. Cl.
 *H01L 21/336* (2006.01)
(52) U.S. Cl. ...................... 438/257; 438/258; 438/593; 438/E21.645; 438/E21.688
(58) Field of Classification Search ........ 438/257–258, 438/593–594
See application file for complete search history.

(56) References Cited

U.S. PATENT DOCUMENTS

| 6,368,907 B1 | 4/2002 | Doi et al. ................... 438/217 |
| 6,656,794 B2 * | 12/2003 | Shibata ....................... 438/258 |
| 2003/0082878 A1 | 5/2003 | Mimuro et al. ............. 438/257 |
| 2004/0041205 A1 | 3/2004 | Shum ......................... 257/326 |

* cited by examiner

*Primary Examiner*—Dung A. Le
(74) *Attorney, Agent, or Firm*—Lisa K. Jorgenson; Robert Iannucci; Seed IP Law Group PLLC

(57) ABSTRACT

A method manufactures a non-volatile memory device on a semiconductor substrate that includes a matrix of memory cells and associated circuitry. The method includes: forming a filling dielectric layer on the whole substrate until gates of the cells and a conductive layer of the circuitry are completely covered, removing the dielectric layer until upper portions of the gates of the cells and the conductive layer are exposed, defining a plurality of gate electrodes of the transistors of the circuitry in the conductive layer, and forming source and drain regions of the transistors of the circuitry in the substrate. The method also comprises: forming spacers on side walls of gate electrodes of the transistors of the circuitry, and forming a silicide layer on the electrodes of the cells, on the gate electrodes of the transistors of the circuitry and on the source and drain regions of the transistors of said circuitry.

24 Claims, 10 Drawing Sheets

METHOD FOR MANUFACTURING ELECTRONIC NON-VOLATILE MEMORY DEVICES INTEGRATED IN A SEMICONDUCTOR SUBSTRATE

BACKGROUND OF THE INVENTION

1. Field of the Invention

The present invention relates to a method for manufacturing non-volatile memory devices integrated on a semiconductor substrate.

More specifically the invention relates to a method for manufacturing non-volatile memory devices integrated on a semiconductor substrate and comprising a matrix of memory cells and an associated circuitry, the method comprising the following steps:

forming a plurality of gate electrodes of said memory cells projecting from said semiconductor substrate in said matrix, said plurality of gate electrodes comprising a plurality of conductive layers;

forming at least one conductive layer in said circuitry;

forming conductive regions of said memory cells in said semiconductor substrate.

The invention particularly, but not exclusively, relates to a method for making some steps of the manufacturing processes of electronic devices containing non-volatile memory cells of the floating gate type with NOR architecture independent from each other and the following description is made with reference to this field of application by way of illustration only.

2. Description of the Related Art

As it is well known, non-volatile memory electronic devices, for example of the EPROM and Flash EEPROM type with NOR architecture, integrated on semiconductor comprise a plurality of matrix-like organised non-volatile memory cells; i.e. the cells are organised in rows, called word lines, and columns, called bit lines.

Each single non-volatile memory cell comprises a MOS transistor wherein the gate electrode, placed above the channel region, is floating, i.e. it has a high impedance in DC towards all the other terminals of the same cell and of the circuit wherein the cell is inserted. Generally, the gate electrode is formed by means of a polysilicon layer.

The cell also comprises a second electrode, called control gate, which is capacitively coupled to the floating gate electrode through an intermediate dielectric layer, so called interpoly. Generally, the control electrode is formed by means of a polysilicon layer. This second electrode is driven through suitable control voltages. The other terminals of the transistor are the usual drain and source regions.

Inside the matrix of the memory cell, cells belonging to a same word line share the electric line which drives the respective control gates, while the cells belonging to a same bit line share the drain regions.

By applying suitable voltage values to the cell terminals, it is possible to vary the amount of charge present in the floating gate, for example by using the known Channel Hot Electrons Injection phenomena, carrying out the programming.

The matrix of memory cells is associated with a control circuit comprising a plurality of MOS transistors, each comprising a source region and a drain region separated from a channel region. A gate electrode is then formed on the channel region and insulated from this by means of a gate oxide layer. Moreover, insulating spacers are provided on the side walls of the gate electrode.

In particular, in the circuitry of new generation memory matrixes of the Flash type with NOR architecture also MOS transistors and having high performances are integrated in the circuitry for embedded applications and for carrying out, at high speed, the complex management algorithms of the memory devices themselves.

To form, inside the circuitry, both these advanced technology transistors and transistors managing the high voltages necessary to ensure the functionality of the memory cell in reading, process steps are used for the formation of the junction implants forming the source and drain regions and the spacers which are particularly complex. There is in fact the need to introduce differentiated spacers and junction implants, in correspondence with the different typologies of transistors to be formed.

Moreover, these process steps for the formation of the spacers are not necessary for the formation of the NOR memory cells which are programmed for channel hot electrons and whose operation instead requires specific junctions self-aligned to the floating gate.

Moreover, the sizes and the conductive materials of the spacers of the circuitry transistors can become a strict constraint for the scalability of the memory cell, in particular for the possible silicidisation process of the drain regions, for the pre-metal filling process, for the integration of the drain contacts and for the sustainability of the reading disturbances.

Moreover the formation of the pre-metal filling layer in the matrix is tied to the maximum thermal budget sustainable by the circuitry transistors and by the silicide layer if any.

BRIEF SUMMARY OF THE INVENTION

One embodiment of the present invention is a method for forming electronic devices that include non-volatile memory cells of the floating gate type, for example with NOR architecture, wherein the pre-metal filling layer is defined in an independent way from the process steps that define the spacers for the circuitry transistors, thus overcoming the limits and drawbacks still limiting the devices formed according to the prior art.

The method includes forming a pre-metal filling layer immediately after the definition of the cell transistors and before the definition of the circuitry transistors.

Advantageously, this pre-metal filling layer is formed by means of deposition of a dielectric conform layer, for example silicon oxide, and subsequently etchback.

Advantageously, the thickness of the insulating conform layer formed must be greater than half the distance between two gate electrodes of the adjacent memory cells so as to ensure a complete filling of the memory matrix.

The characteristics and advantages of the method according to the invention will be apparent from the following description of an embodiment thereof given by way of indicative and non limiting example with reference to the annexed drawings.

DETAILED DESCRIPTION OF THE INVENTION

Figure 1:
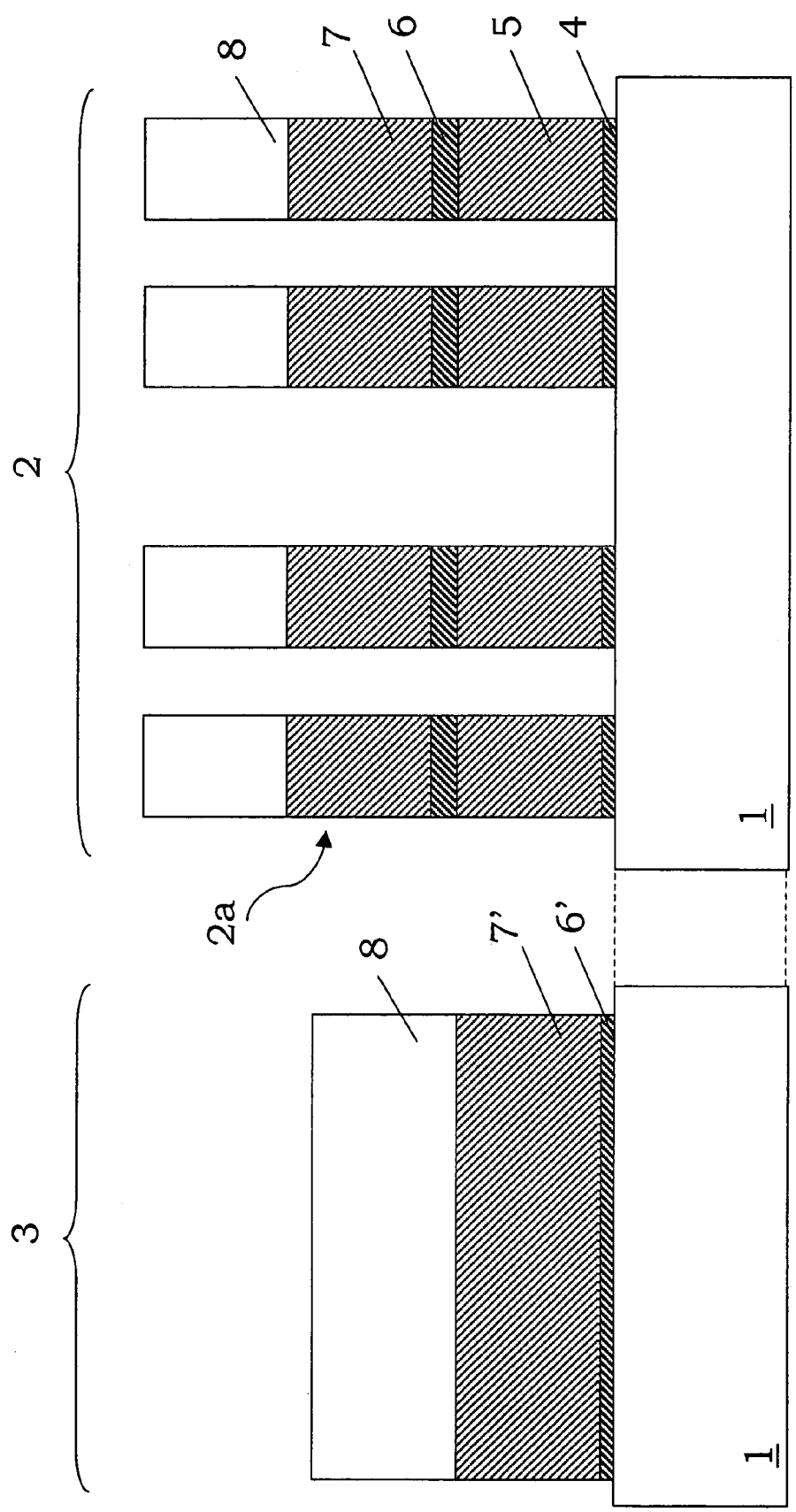
FIGS. 1 to 10 are respective section schematic views of a portion of integrated circuit during the successive manufacturing steps of a method according to the present invention.

With reference to the figures, a method is described for manufacturing a non-volatile memory device integrated on a semiconductor substrate 1 and comprising a matrix 2 of non-volatile memory cells and associated circuitry 3.

The process steps described hereafter do not form a complete process flow for manufacturing integrated circuits. The present invention can be put into practice together with the manufacturing techniques of the integrated circuits currently used in the field, and only those commonly used process steps being necessary for the comprehension of the present invention are included.

The figures showing cross sections of portions of an integrated circuit during the manufacturing are not drawn to scale, but they are instead drawn so as to show the important characteristics of the invention.

In particular, on the semiconductor substrate 1, after having formed a field oxide layer and having defined, in a known way, active areas in this field oxide layer for the memory matrix 2 and for the circuitry 3, in the memory matrix 2 a stack is formed comprising a first gate dielectric layer 4 of the memory cell, called tunnel oxide, a first conductive layer 5, for example of polysilicon, a second interpoly dielectric layer 6. This second interpoly dielectric layer 6 is for example an oxide layer or the overlapping of more layers, for example ONO (oxide/nitride/oxide).

The stack in memory is then completed with a second conductive layer 7, for example of polysilicon, as shown in FIG. 1.

In the circuitry 3 a stack is instead formed comprising, for example, a gate dielectric layer 6' of the circuitry and a conductive layer 7' of the circuitry 3. Advantageously, the gate dielectric layer 6' of the circuitry and the conductive layer 7' of the circuitry 3 are formed, respectively, by the interpoly dielectric layer 6 and by the second conductive layer 7 used in the matrix 2.

Through a conventional photo-lithographic process using a first resist mask 8, a self-aligned etching step of the stack formed in the matrix 2 follows. The second conductive layer 7, the second interpoly dielectric layer 6, the first conductive layer 5 and the first gate dielectric layer 4 of the memory cell are then etched in cascade so as to form gates 2a of the memory cells, wherein from the first conductive layer 5 the floating gate electrodes of the cells are formed.

Advantageously, the mask 8 completely shields the circuitry 3, thereby the second gate dielectric layer 6' and the conductive layer 7' of the circuitry 3 are not removed during this last etching step.

Figure 2:
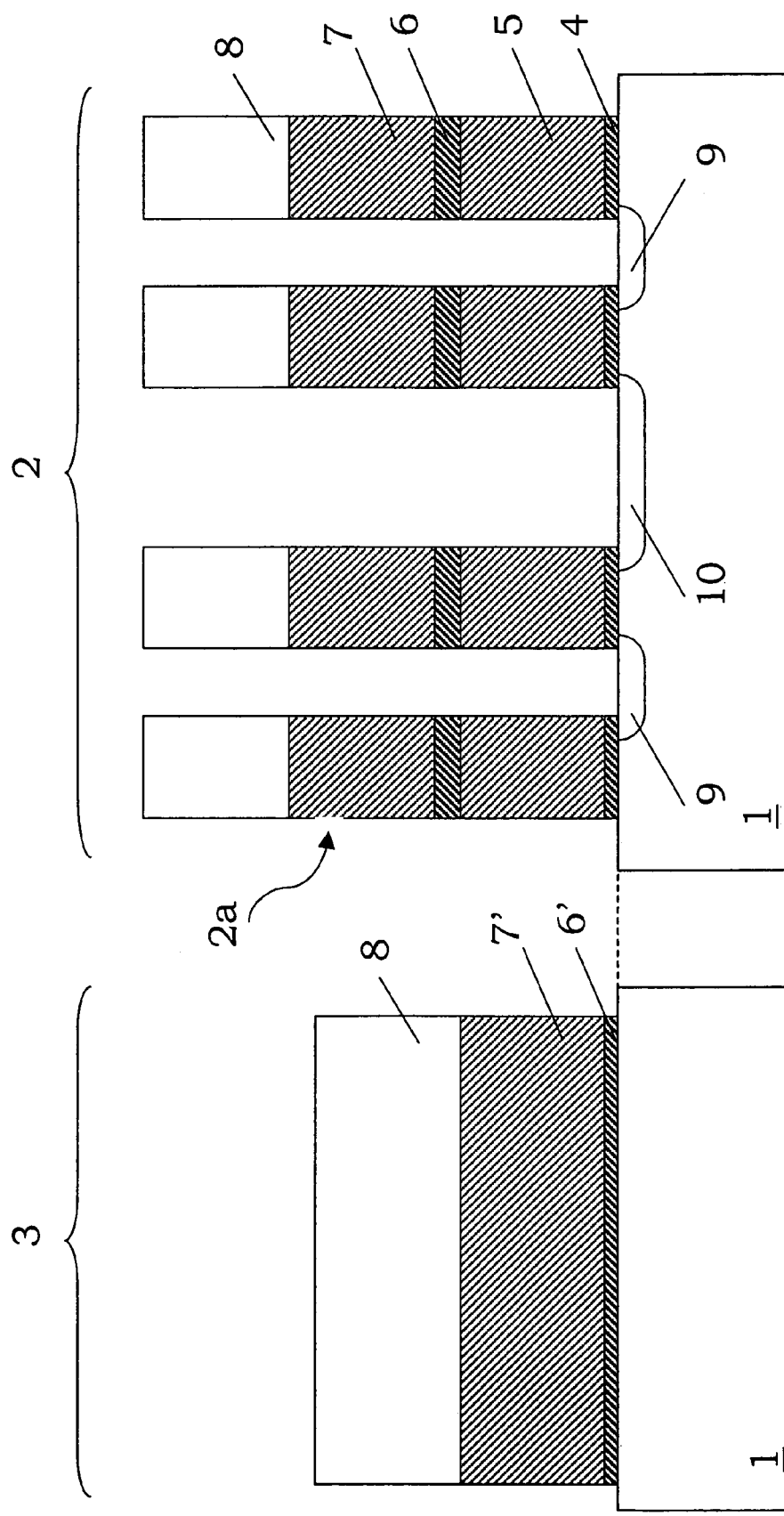

As shown in FIG. 2, source 9 and drain 10 regions of the memory cells are then formed by means of a self-aligned implant.

Advantageously, pairs of adjacent cells belonging to adjacent wordlines share the same drain region 10.

Figure 3:
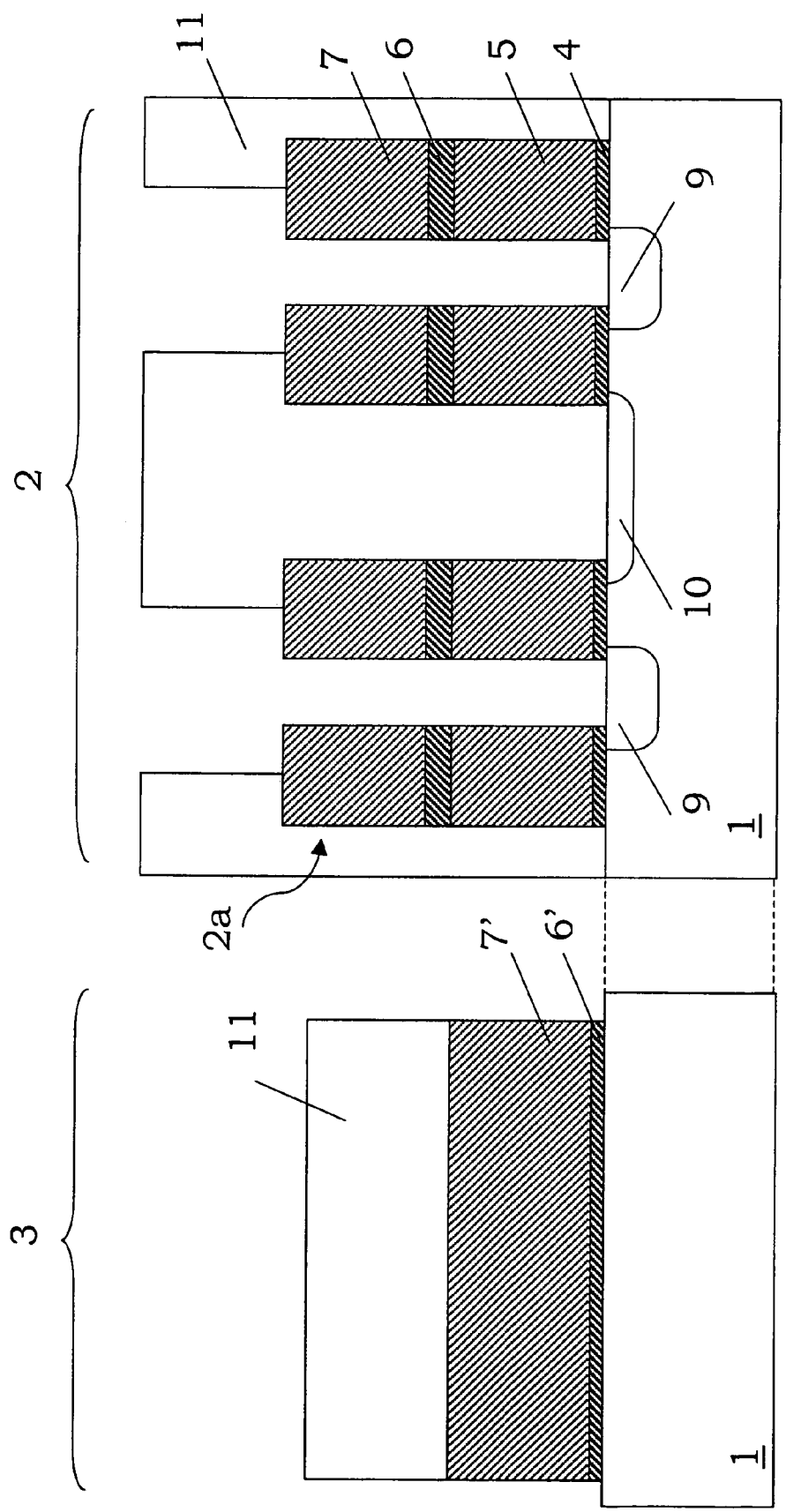

The first mask 8 is removed, and then by means of second mask 11 which opens only on the source regions 9 of the cells of the matrix 2, the field oxide layer is etched serving as insulation between the memory cells in the direction perpendicular to the one shown in the figures and a second self-aligned implant is formed which forms the connection shared by the source regions 9 of the memory cells (FIG. 3).

Figure 4:
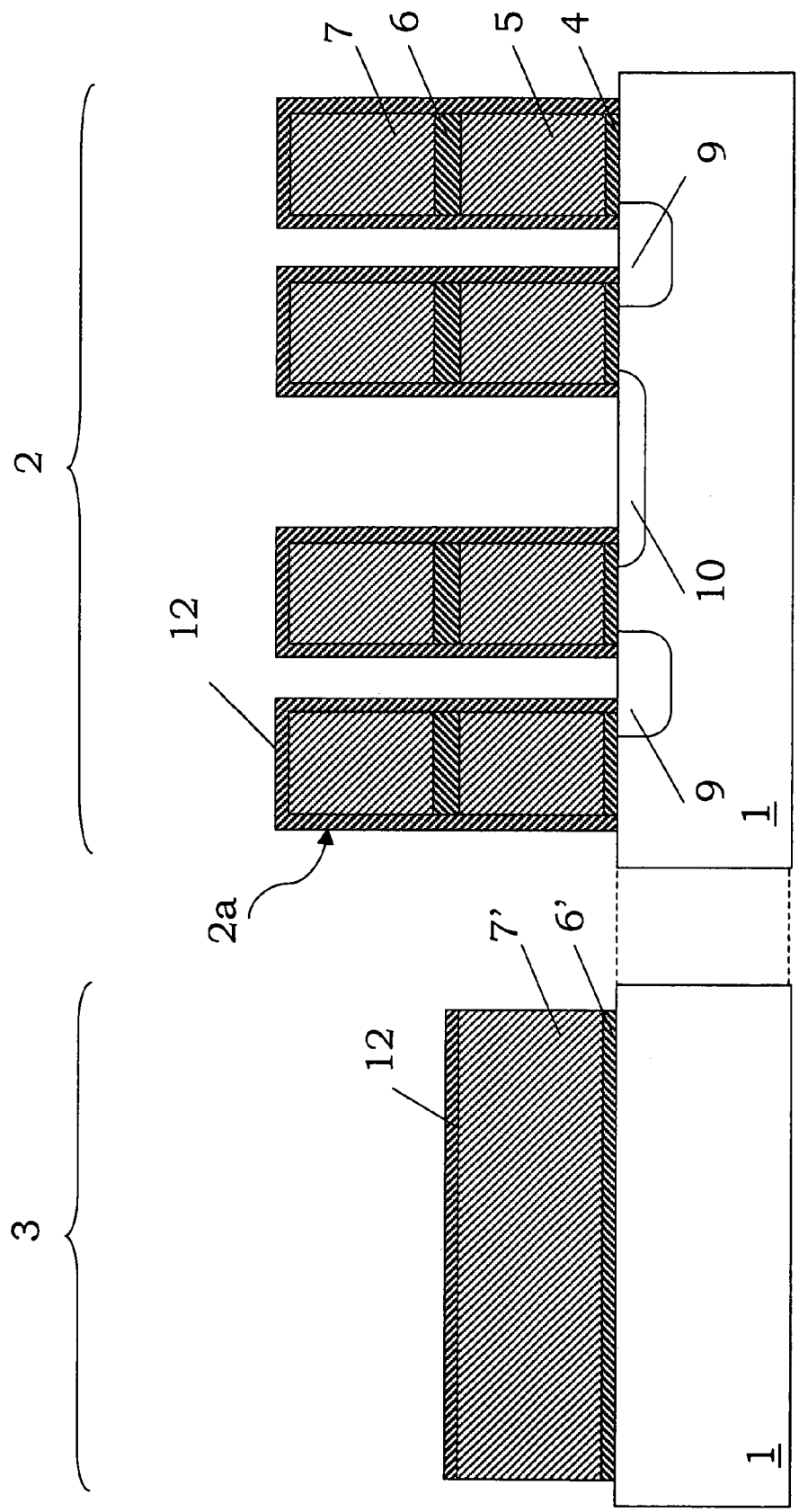

After the implants for the formation of the source 9 and drain regions 10 of the cells in the matrix 2 and after the second mask 11 is removed, advantageously the memory cells are sealed by means of re-oxidation treatment and/or deposition of a thin oxide layer 12 which serves as insulation of the floating gate, as shown in FIG. 4. Since transistors of the circuitry 2 have not been defined yet, these steps act only on the upper surface of the conductive layer 7' which will form electrodes of the transistors of the circuitry 3.

According to one embodiment of the invention, after the definition of the cells of the matrix 2, a filling dielectric layer 13 is formed to fill the spaces between the wordlines above the drain 9 and source regions 10. For example this layer is an oxide with high filling properties and high conformity, of thickness not lower than half the maximum distance between two electrodes of adjacent memory cells, i.e. between two wordlines of the matrix, so as to completely fill in the matrix 2 itself.

The filling dielectric layer 13 is for example TEOS (Tetra-Ethyl-Ortho-Silicate) or HTO (High Temperature Oxide).

Nothing forbids that the filling dielectric layer 13 is a dielectric layer with fluidity characteristics, for example SOG (Spin-on Glass Oxide), which is then subjected to a densification treatment.

Figure 5:
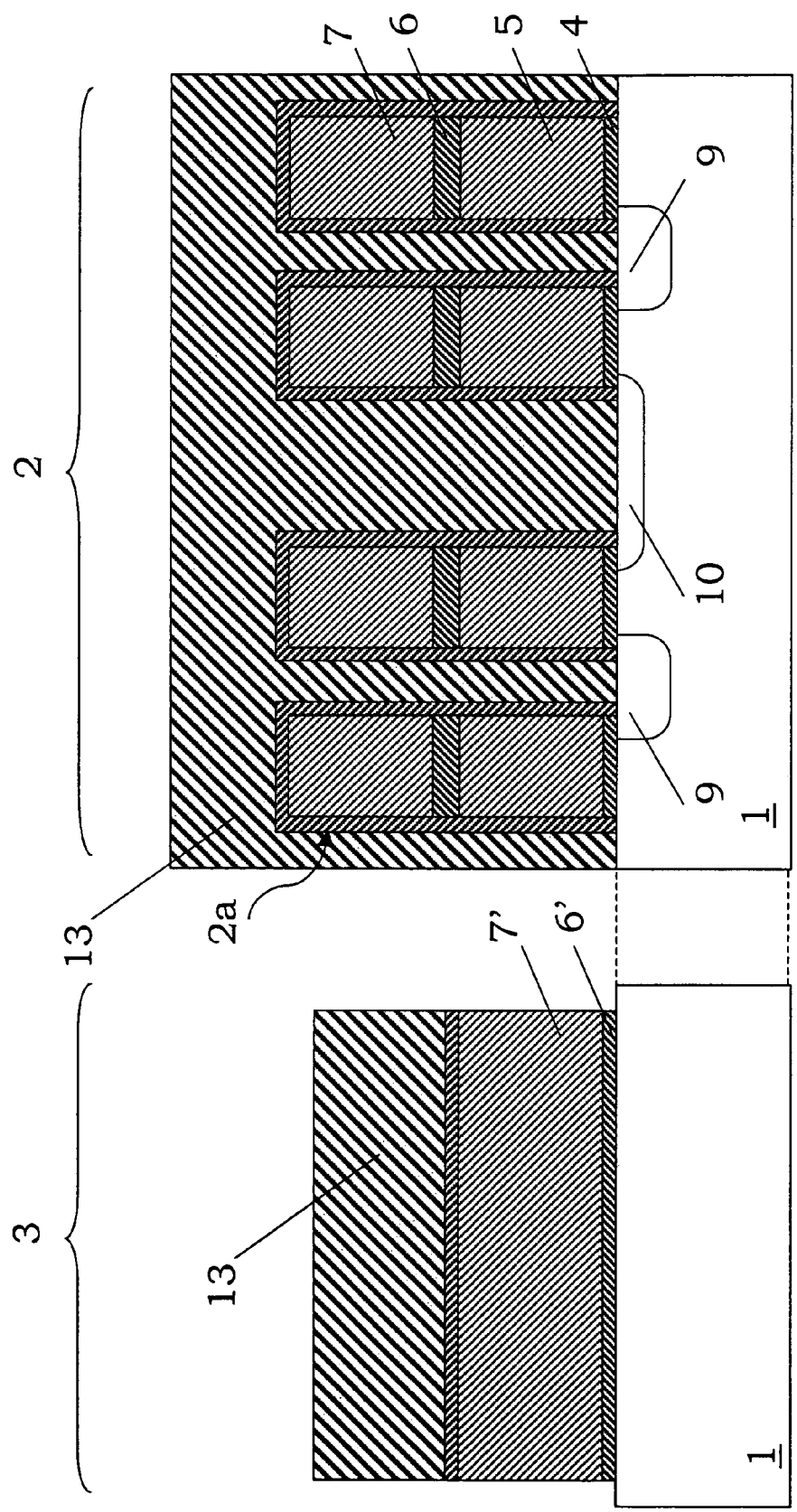

Since the transistors of the circuitry 3 have not been defined yet, this filling dielectric layer 13 has a uniform thickness above the polysilicon layer 7' of the transistors of the circuitry 3, as shown in FIG. 5. The thermal budget relative to the formation of this filling dielectric layer 13 has reduced impact on these transistors of the circuitry 3 since the junctions forming the source and drain regions of these transistors have not been defined yet.

With the method according to one embodiment of the invention then no constraints are imposed between the filling steps of the matrix 2 and the critical definition steps of the source and drain regions of the transistors of the circuitry 3 with high performances.

Subsequently, the filling dielectric layer 13 then is subjected to an etching step until the polysilicon layers 7 and 7' are uncovered. This etching step, for example of the anisotropic type, is carried out on the whole semiconductor substrate 1 without any masking. In this way, the filling dielectric layer 13 is completely removed from the circuitry 3 and partially from the matrix 2, where only upper portions 2b of the gate electrodes 2a of the cells remain uncovered.

Figure 6:
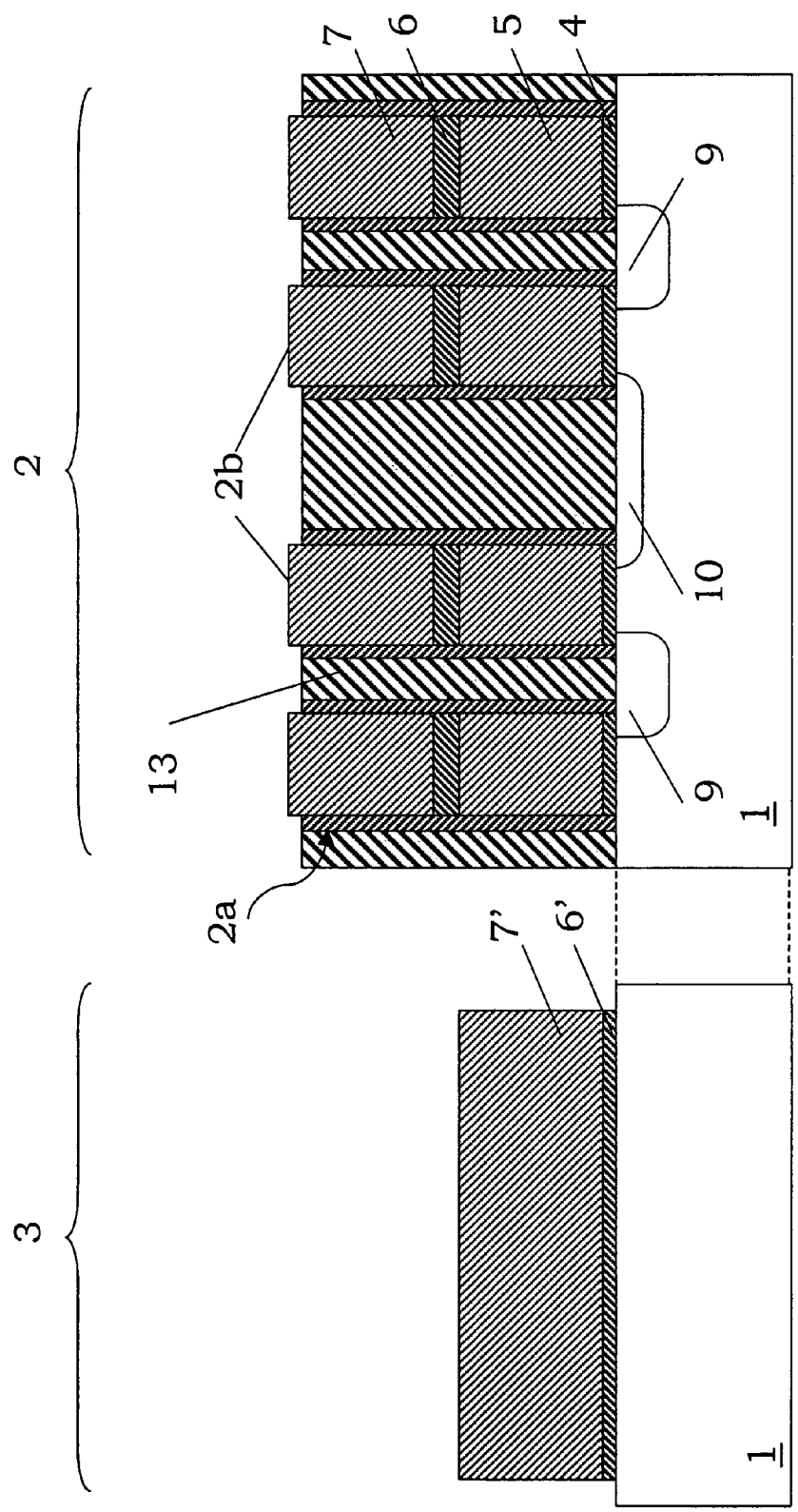

As shown in FIG. 6, the surface of the matrix 2 is at this point substantially planarized.

Figure 7:
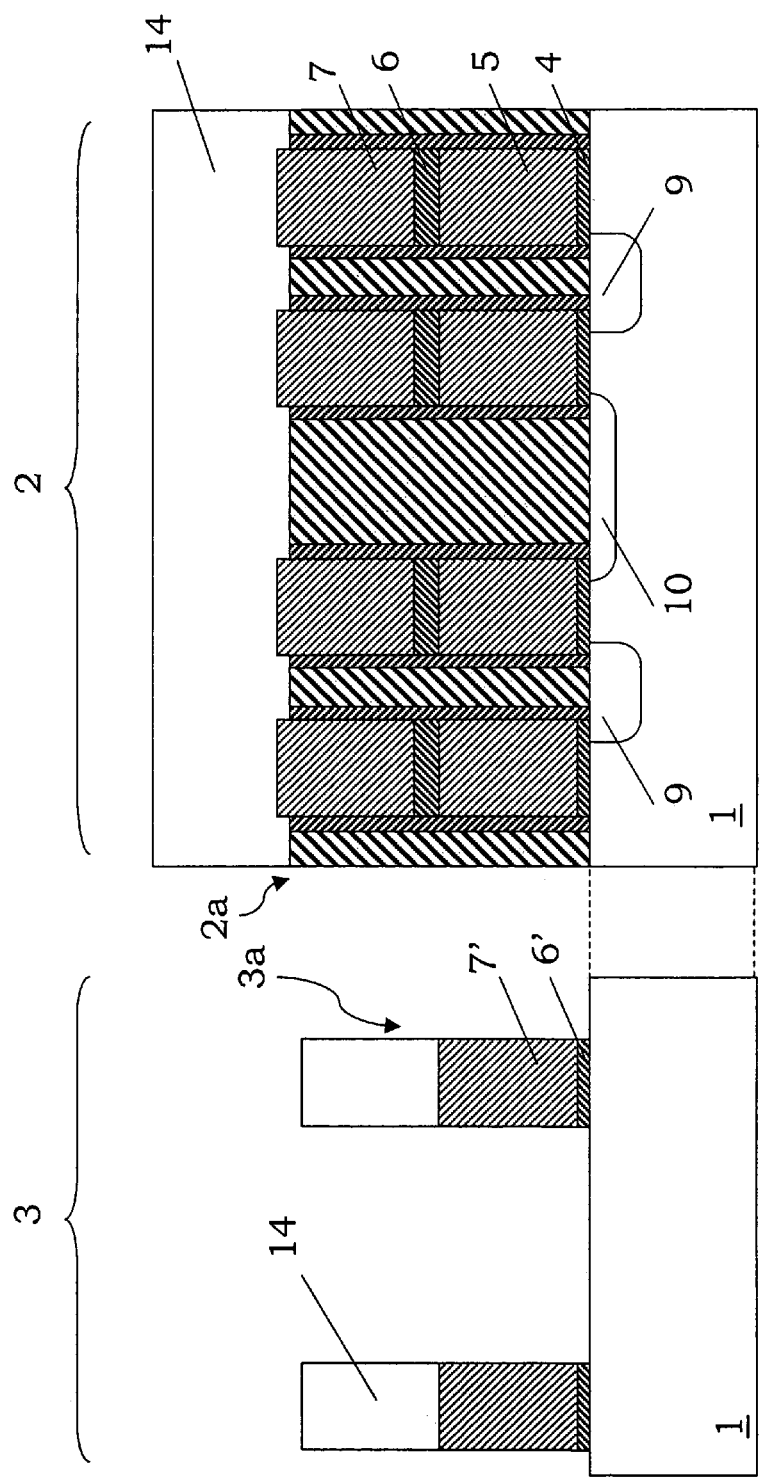

The process goes on with the definition of gate electrodes 3a of the circuitry transistors in the polysilicon layer 7' through a conventional photo-lithographic process which uses a third resist mask 14, as shown in FIG. 7. This step does not bring further modifications with respect to the conventional process steps since the process steps according to the invention do not cause variations on the conductive layer 7' to be etched in the circuitry 3 and on the overall morphology of the wafer.

Figure 8:
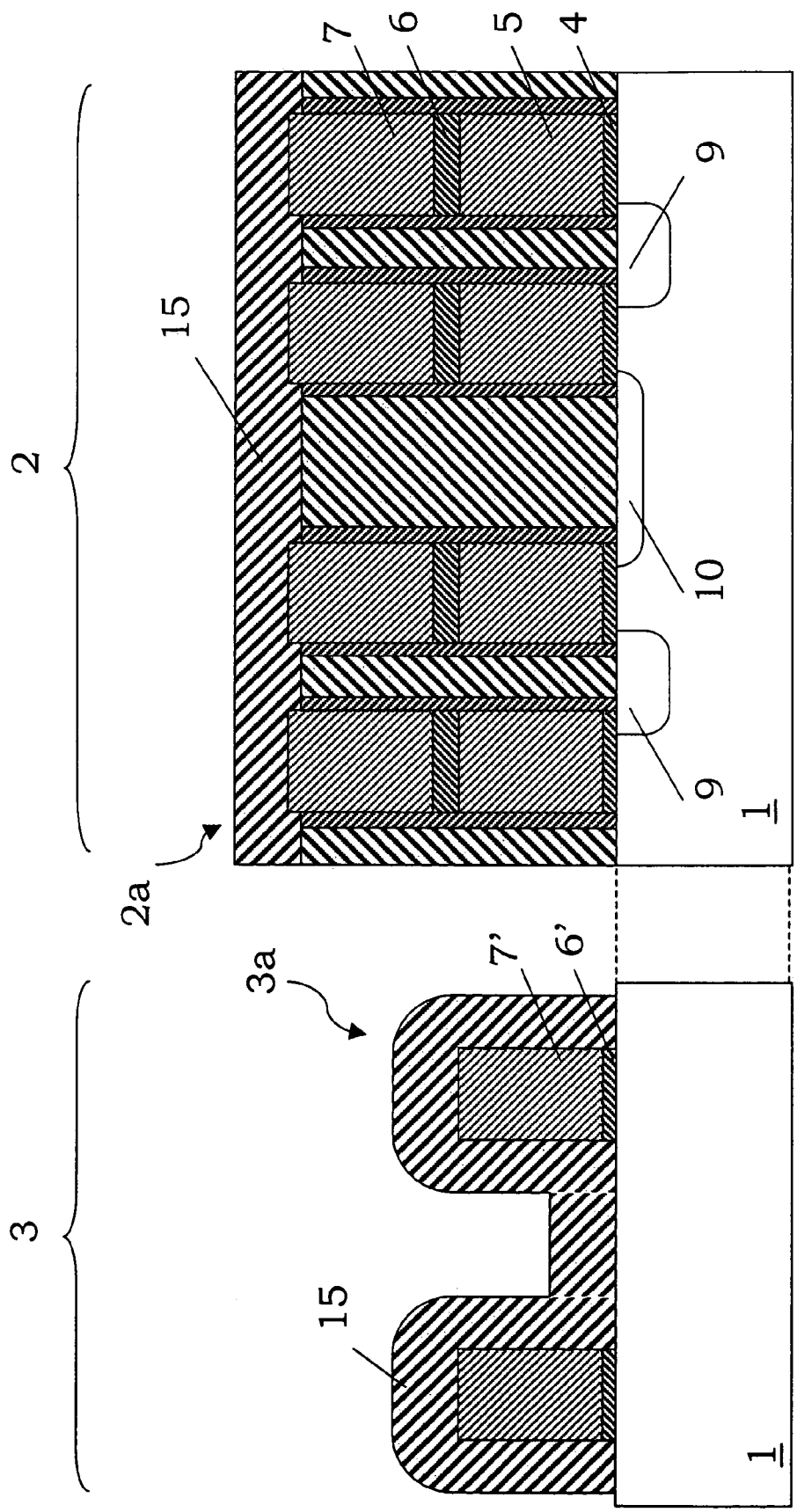

To complete the definition of the transistors of circuitry 3, as shown in FIG. 8, besides the suitable junction implants for forming source and drain regions, which, being conventionally formed by means of masking, do not influence the matrix 2, at least one insulating layer 15 is formed on the whole semiconductor substrate 1 to form spacers 16 of these transistors of circuitry 3.

In particular, in the circuitry 3 this insulating layer 15 follows in a conform way, the profile of the gate electrodes 3a defined in the circuitry 3, while in the matrix 2 the deposition occurs on a substantially planarized surface.

Figure 9:
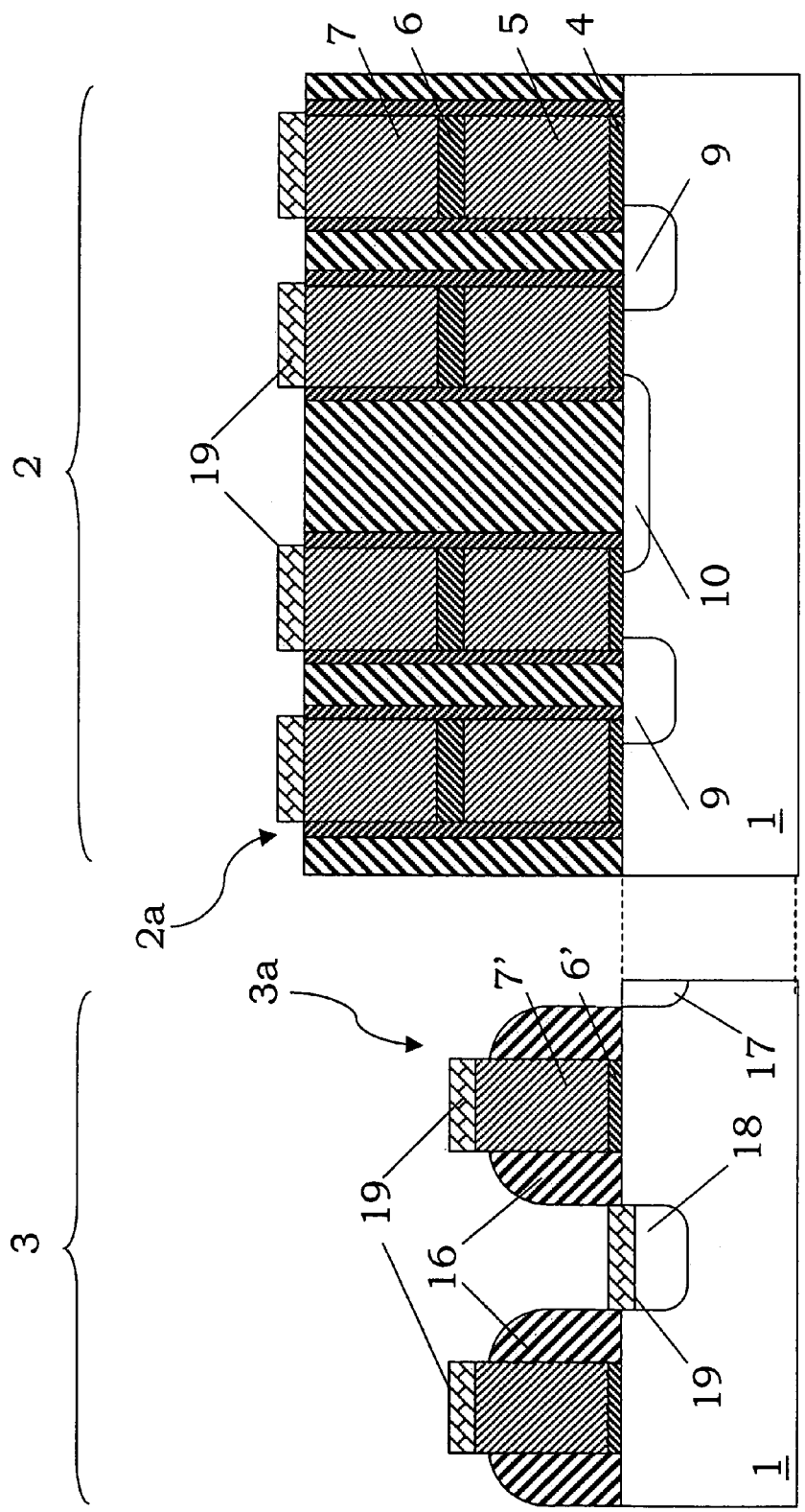

As shown in FIG. 9, the spacers 16 are defined in the circuitry 3 through etching of the insulating layer 15. This process does not leave traces in the matrix 2 since the surface is substantially planarized.

Depending on the type of transistors necessary in the circuitry 3, the definition of the spacers 16 can occur by means of different deposition steps of insulating layers and corresponding etchings, also using possible additional masks so as to differentiate the spacers 16 in different regions of the circuitry. In any case there are no impacts on the matrix 2, limiting possible overetches of the etchings in matrix 2 so as not to jeopardize the planarity of the matrix 3.

After forming the spacers 16, the method forms, by implantation, the source and drain regions 17, 18 of the circuitry transistors, as shown in FIG. 9.

Then a silicidation step is carried out on the whole semiconductor substrate 1 which forms a silicide layer 19 only on the areas of semiconductor substrate 1 exposed, i.e. on the active areas of circuitry 3, on the polysilicon layer 7' of circuitry 3 and on top of the gates 2a of the memory cells, i.e. of the matrix 2 wordlines.

Figure 10:
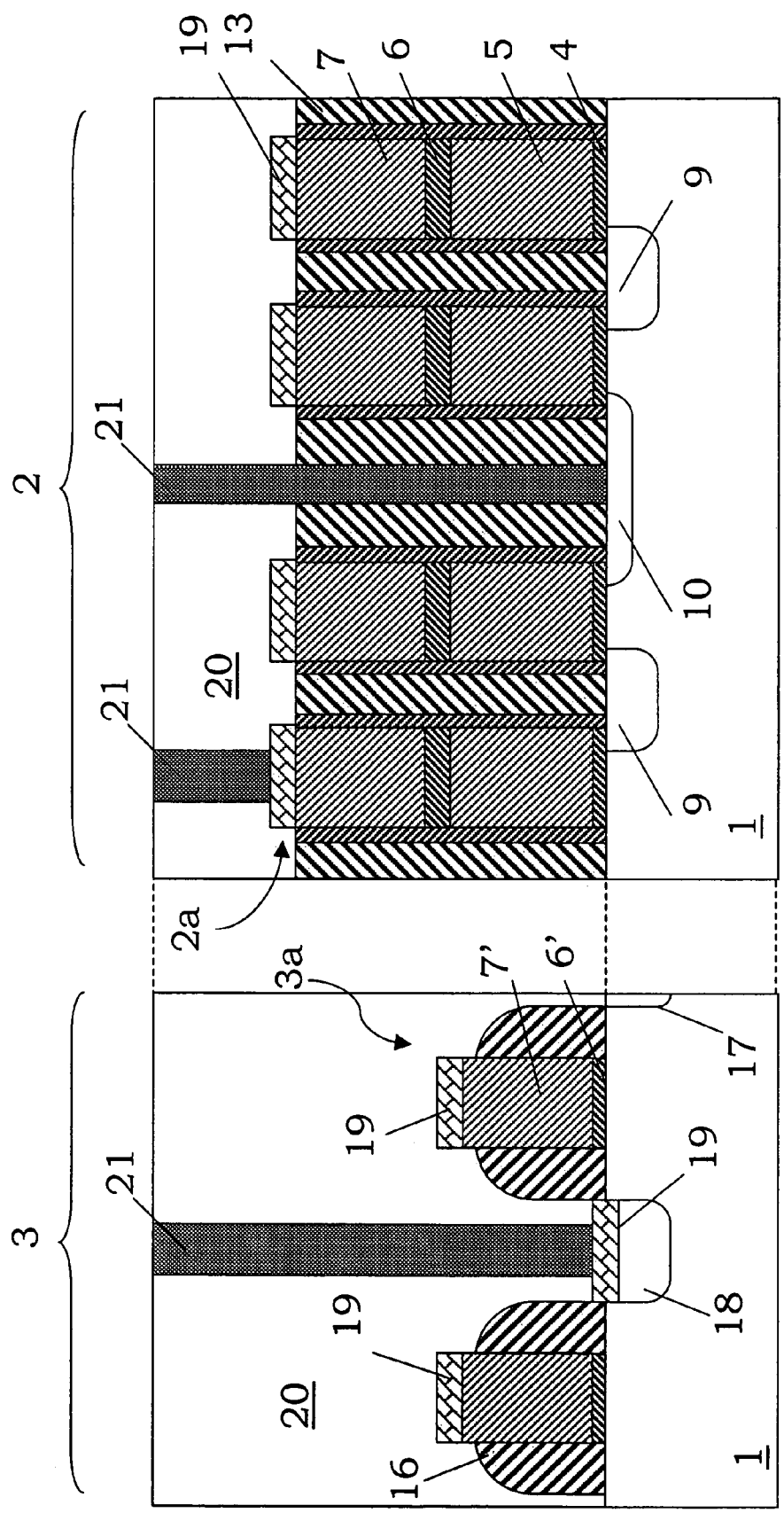

As shown in FIG. 10, at the end of the deposition process of the silicide layer 19 a complete pre-metal filling layer 20 is formed. This pre-metal filling layer 20 completely covers the plurality of gate electrodes 3a of the transistors of the circuitry 3 and the plurality of matrix gates 2a.

This filling layer 20 is for example a non-doped or doped silicon oxide layer (BPSG).

The filling layer 20 is planarized by means of CMP and contacts 21 are defined.

The definition of the contacts 19 can include different alternatives in consequence of the materials used for the filling dielectric layers 13, 14 used for filling the matrix 2 and the circuitry 3 due to the absence of the silicide layer on the active areas of matrix 2. For example the contacts in the matrix 2 can be defined with a first dedicated mask, an anisotropic etching and an implant with the contacts open, and the contacts in circuitry with a second mask and etching.

The manufacturing process of the memory cells goes on with conventional definition of the backend.

All in the all, the method has the following advantages for the integration advanced technology floating gate memories with transistors having high performances of technology parts:

smaller constraints on the definition process of the spacers 16 of circuitry 3,
no constraints between the filling process steps of the matrix, which typically has particularly critical aspect ratios, and the highest thermal treatment sustainable by the transistors of the circuitry for the stability of the silicide layer 19 and the control of the diffusion of the junctions of the source and drain regions,
smaller constraints on the integration of the silicide layer 19, which, in the matrix 2, is formed only on the polysilicon layer constituting the wordlines.

As it has been noted in case the material forming the pre-metal filling layer 20 of circuitry differs from the material of the cell pre-metal filling dielectric layer 13, the process can provide the use of a definition separated from the contacts.

These last steps are not however a limitation of the method according to the invention, since, with the continuous scaling of the technology and the increase of memory density, contacts separated between matrix and circuitry are however requested, so as to optimize the relative problems and to align the contacts to the structures of matrix and circuitry at best.

In conclusion, with the method described above, the transistors of the circuitry are defined subsequently to the memory cells of the matrix, so as to completely untie the process steps being critical for the definition of the transistors of circuitry 3 from the filling steps of the matrix of memory cells.

For this reason the method is particularly advantageous for Flash embedded applications or however for Flash with high performance circuitry.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for manufacturing a non-volatile memory device integrated on a semiconductor substrate, the device including a matrix of memory cells and associated circuitry, the method comprising the following steps:

forming a plurality of gates of said memory cells projecting from said semiconductor substrate in said matrix, said plurality of gates comprising a plurality of conductive layers;
forming at least one conductive layer in said circuitry;
forming source and drain regions of said memory cells in said semiconductor substrate;
forming a filling dielectric layer on the matrix and circuitry until said plurality of gates of said cells and said at least one conductive layer formed in said circuitry are completely covered;
removing said filling dielectric layer until upper portions of said plurality of gates of said cells are exposed and said at least one conductive layer formed in said circuitry is completely exposed;
after removing said filling dielectric layer from said at least one conductive layer, defining a plurality of gate electrodes of transistors of said circuitry in said conductive layer formed in said circuitry; and
forming source and drain regions of said transistors of said circuitry in said semiconductor substrate.

2. The method according to claim 1, wherein said filling dielectric layer is made of a conform oxide layer with high filling properties.

3. The method according to claim 1 wherein said filling dielectric layer is formed with an thickness greater than half of a distance between two gate electrodes of adjacent memory cells.

4. The method according to claim 1, wherein forming said filling dielectric layer includes:

forming an oxide layer with high fluidity; and
densifying the oxide layer through thermal treatment.

5. The method according to claim 1, further comprising forming spacers on side walls of said plurality of gate electrodes of the transistors of said circuitry.

6. The method according to claim 5, further comprising forming a layer of filling material on the matrix and circuitry until said plurality of gate electrodes of the transistors of said circuitry is covered and said plurality of gates is completely covered.

7. The method according to claim 6, wherein said conform filling dielectric layer and layer of filling material are made of different materials.

8. The method according to claim 1, wherein removing said filling dielectric layer includes anisotropically etching said filling dielectric layer until said conductive layer of said circuitry and an upper one of said conductive layers in said matrix are uncovered, which substantially planarizes said matrix.

9. The method according to claim 8, further comprising forming a silicide layer on said plurality of gates of the memory cells, on said plurality of gate electrodes of the transistors of said circuitry and on said source and drain regions of the transistors of said circuitry.

10. The method according to claim 8, wherein contacts for the source and drain regions of said matrix and of said circuitry are formed in a same step.

11. The method according to claim 8, wherein contacts for the source and drain regions of said matrix and of said circuitry are formed in different steps.

12. A method for manufacturing a non-volatile memory device integrated on a semiconductor substrate, the device including a matrix of memory cells and associated circuitry, the method comprising:

forming a plurality of gates of the memory cells projecting from the semiconductor substrate in the matrix, the plurality of gates comprising a plurality of conductive layers;
  forming a conductive layer in the circuitry;
  forming source and drain regions of the memory cells in the semiconductor substrate;
  forming a filling dielectric layer on the matrix until the gates of the cells are completely covered;
  removing an upper portion of the filling dielectric layer, thereby exposing upper portions of the gates of the cells and leaving lower portions of the filling dielectric layer between the gates of the cells;
  after removing the filling dielectric layer, defining a plurality of gate electrodes of transistors of the circuitry in the conductive layer formed in the circuitry; and
  forming source and drain regions of the transistors of the circuitry in the semiconductor substrate.

13. The method of claim 12, wherein the filling dielectric layer is made of a conform oxide layer with high filling properties.

14. The method of claim 12 wherein the filling dielectric layer is formed with an thickness greater than half of distance between two gate electrodes of adjacent memory cells.

15. The method of claim 12, further comprising forming spacers on side walls of the gate electrodes of the transistors of the circuitry after removing the upper portions of the filling dielectric layer.

16. The method of claim 12, further comprising forming a layer of filling material that completely covers the gate electrodes of the transistors of the circuitry and the gates of the cells.

17. The method of claim 16, wherein the conform filling dielectric layer and layer of filling material are made of different materials.

18. The method of claim 12, wherein removing the filling dielectric layer includes etching the filling dielectric layer without using a mask during the etching.

19. A method for manufacturing a non-volatile memory device integrated on a semiconductor substrate, the device including a matrix of memory cells and associated circuitry, the method comprising:

forming a plurality of gates of the memory cells projecting from the semiconductor substrate in the matrix, the plurality of gates comprising a plurality of conductive layers;
  forming a conductive layer in the circuitry;
  forming source and drain regions of the memory cells in the semiconductor substrate;
  filling spaces between the gates of the cells with a filling dielectric;
  after the filling step, defining a plurality of gate electrodes of transistors of the circuitry in the conductive layer formed in the circuitry; and
  forming source and drain regions of the transistors of the circuitry in the semiconductor substrate.

20. The method of claim 19, wherein the filling dielectric is made of a conform oxide layer with high filling properties.

21. The method of claim 19, further comprising forming spacers on side walls of the gate electrodes of the transistors of the circuitry after defining the gate electrodes.

22. The method of claim 19, further comprising forming a layer of filling material that completely covers the gate electrodes of the transistors of the circuitry and the gates of the cells.

23. The method of claim 19 wherein the filling step includes:

filling the spaces between the cells with a fluid dielectric material; and
  subjecting the fluid dielectric material with a densification treatment.

24. The method of claim 19, wherein the filling step includes:

coving the matrix with a dielectric layer of the filling dielectric; and
  etching the filling dielectric layer without using a mask during the etching.

* * * * *